(12) United States Patent
Elliott et al.

(10) Patent No.: US 6,955,197 B2
(45) Date of Patent: Oct. 18, 2005

(54) SUBSTRATE CARRIER HAVING DOOR LATCHING AND SUBSTRATE CLAMPING MECHANISMS

(75) Inventors: Martin R. Elliott, Round Rock, TX (US); Michael R. Rice, Pleasanton, CA (US); Robert B. Lowrance, Los Gatos, CA (US); Jeffrey C. Hudgens, San Francisco, CA (US); Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 10/650,311

(22) Filed: Aug. 28, 2003

(65) Prior Publication Data

US 2004/0081545 A1 Apr. 29, 2004

Related U.S. Application Data

(60) Provisional application No. 60/407,340, filed on Aug. 31, 2002, provisional application No. 60/407,451, filed on Aug. 31, 2002, provisional application No. 60/407,339, filed on Aug. 31, 2002, provisional application No. 60/407,474, filed on Aug. 31, 2002, provisional application No. 60/407,336, filed on Aug. 31, 2002, provisional application No. 60/407,452, filed on Aug. 31, 2002, provisional application No. 60/407,337, filed on Aug. 31, 2002, provisional application No. 60/443,087, filed on Jan. 27, 2003, provisional application No. 60/407,463, filed on Aug. 31, 2002, provisional application No. 60/443,004, filed on Jan. 27, 2003, provisional application No. 60/443,153, filed on Jan. 27, 2003, provisional application No. 60/443,001, filed on Jan. 27, 2003, and provisional application No. 60/443,115, filed on Jan. 27, 2003.

(51) Int. Cl.[7] .............................................. B65B 1/04

(52) U.S. Cl. ........................ 141/98; 141/93; 414/217; 414/331; 414/940

(58) Field of Search ........................ 141/98, 65, 66, 141/93; 414/217, 331, 940, 416, 331.14, 331.15, 331.16, 331.17, 331.18

(56) References Cited

U.S. PATENT DOCUMENTS

| | | | |
|---|---|---|---|
| 4,401,522 A | 8/1983 | Buschow et al. | 204/15 |
| 4,534,843 A | 8/1985 | Johnson et al. | 204/202 |
| 4,540,088 A | 9/1985 | Bergh | 198/803 |
| 4,650,264 A | 3/1987 | Dahnert | 312/268 |
| 4,775,046 A | 10/1988 | Gramarossa et al. | 198/803.8 |
| 4,927,438 A | 5/1990 | Mears et al. | |
| 5,048,164 A | 9/1991 | Harima | |
| 5,261,935 A | 11/1993 | Ishii et al. | |
| 5,603,777 A | 2/1997 | Ohashi | |
| 5,762,544 A | 6/1998 | Zuniga et al. | 451/285 |
| 5,827,118 A | 10/1998 | Johnson et al. | |
| 5,829,939 A | 11/1998 | Iwai et al. | |
| 6,054,181 A | 4/2000 | Nanbu et al. | |
| 6,082,949 A | 7/2000 | Rosenquist | |
| 6,235,634 B1 | 5/2001 | Law et al. | 438/680 |
| 6,280,134 B1 | 8/2001 | Nering | |
| 6,283,692 B1 | 9/2001 | Perlov et al. | |
| 6,409,448 B1 | 6/2002 | Sindledecker | |
| 6,439,822 B1 | 8/2002 | Kimura et al. | |
| 2002/0090282 A1 | 7/2002 | Bachrach | 414/271 |
| 2003/0010449 A1 | 1/2003 | Gramarossa et al. | 156/345.31 |

FOREIGN PATENT DOCUMENTS

| | | |
|---|---|---|
| EP | 0 582 019 A1 | 2/1994 |
| EP | 0 987 750 A1 | 3/2000 |
| EP | 1 134 641 A1 | 9/2001 |
| JP | 10-256346 | 9/1998 |
| WO | WO 99/64207 A1 | 12/1999 |
| WO | WO 02/19392 A1 | 3/2002 |

Primary Examiner—Steven O. Douglas
(74) Attorney, Agent, or Firm—Dugan & Dugan

(57) ABSTRACT

In a first aspect, an automatic door opener is provided that includes (1) a platform adapted to support a substrate carrier; (2) a door opening mechanism adapted to open a door of the substrate carrier while the substrate carrier is supported by the platform; and (3) a tunnel. The tunnel is adapted to extend from an opening in a clean room wall toward the platform and at least partially surround the platform. The tunnel is further adapted to direct a flow of air from the clean room wall toward the platform and out of the tunnel. Numerous other aspects are provided.

26 Claims, 15 Drawing Sheets

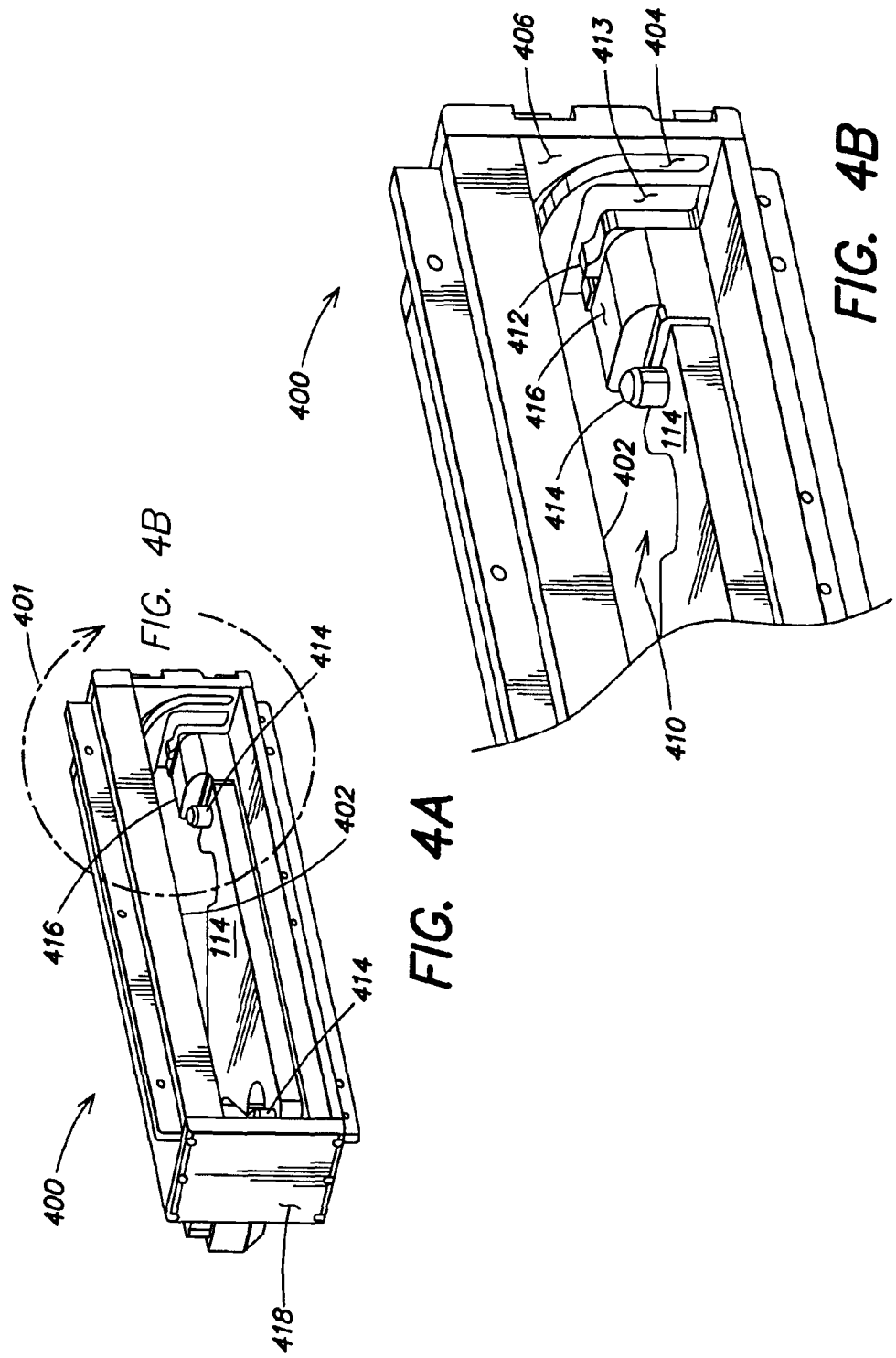

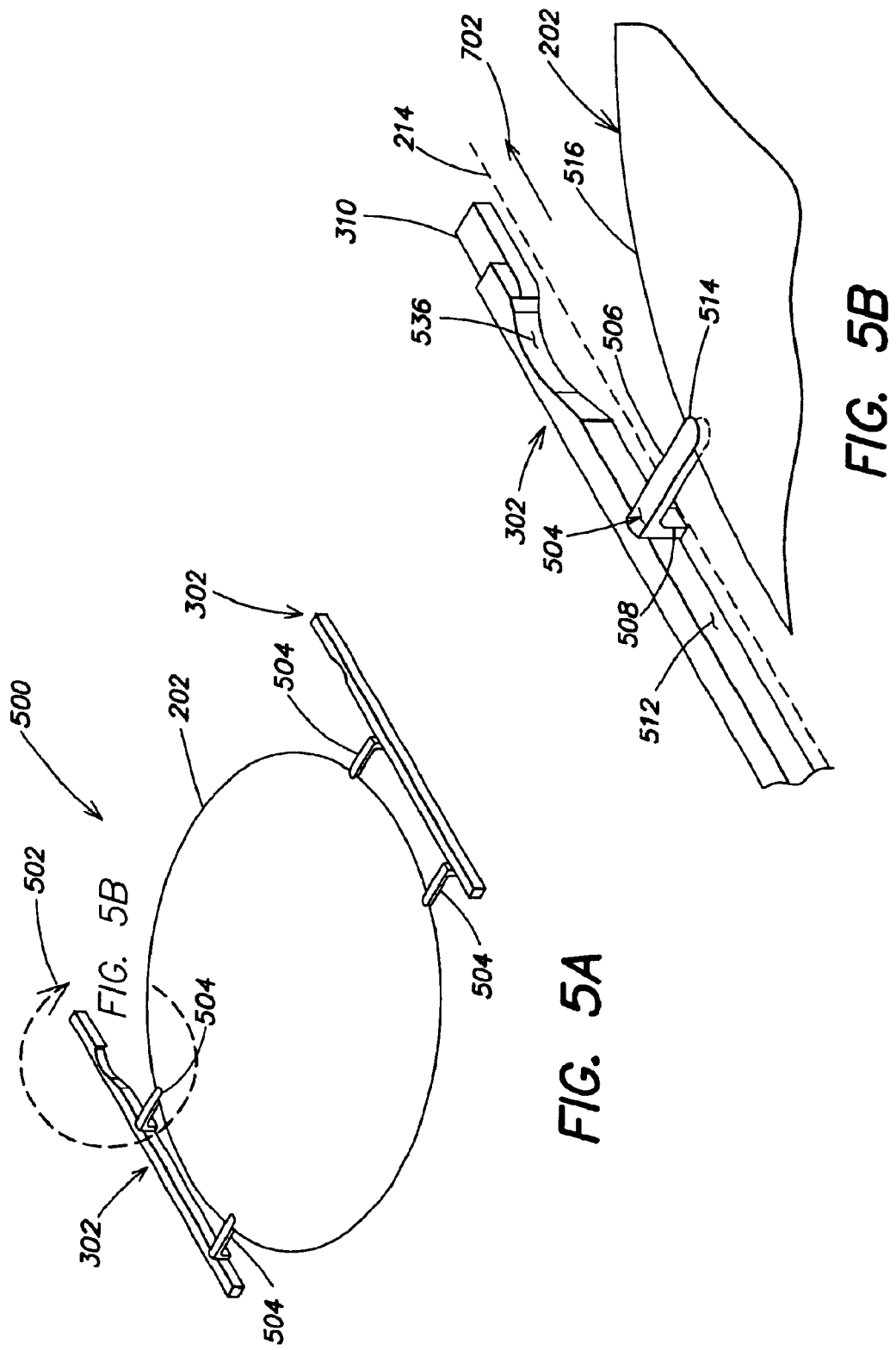

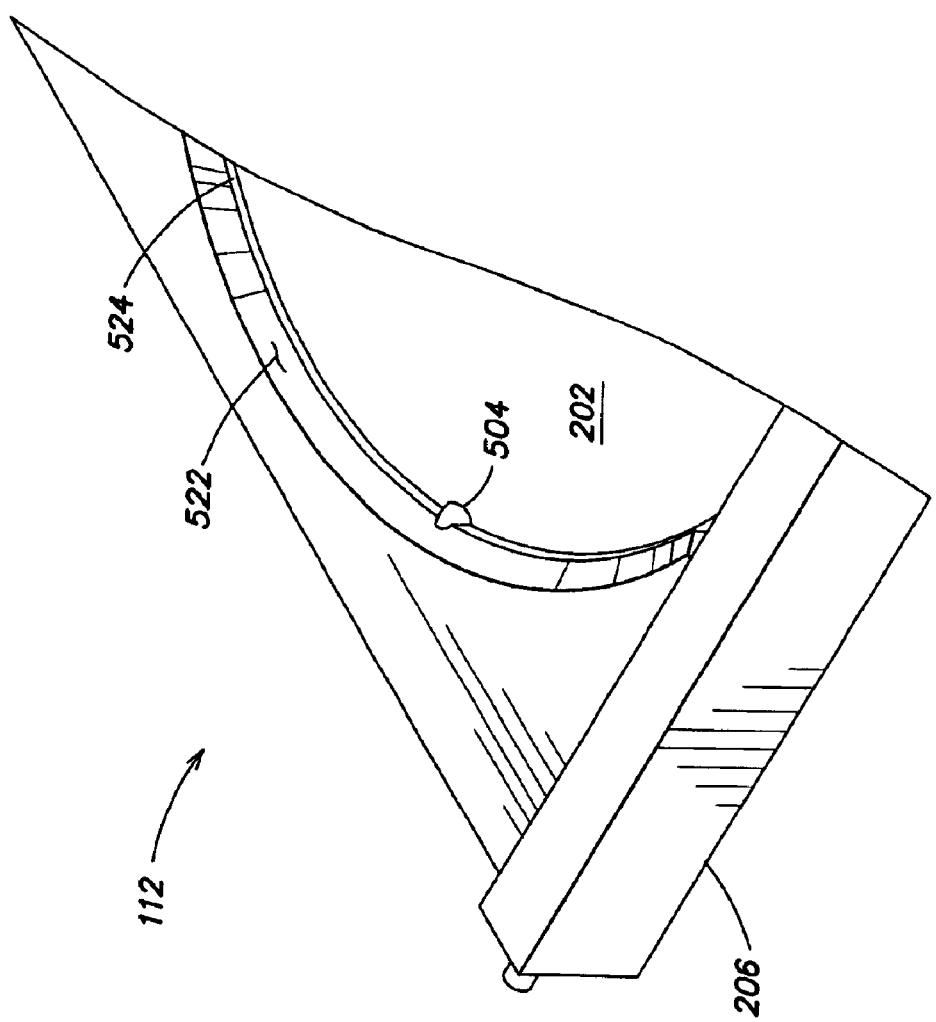

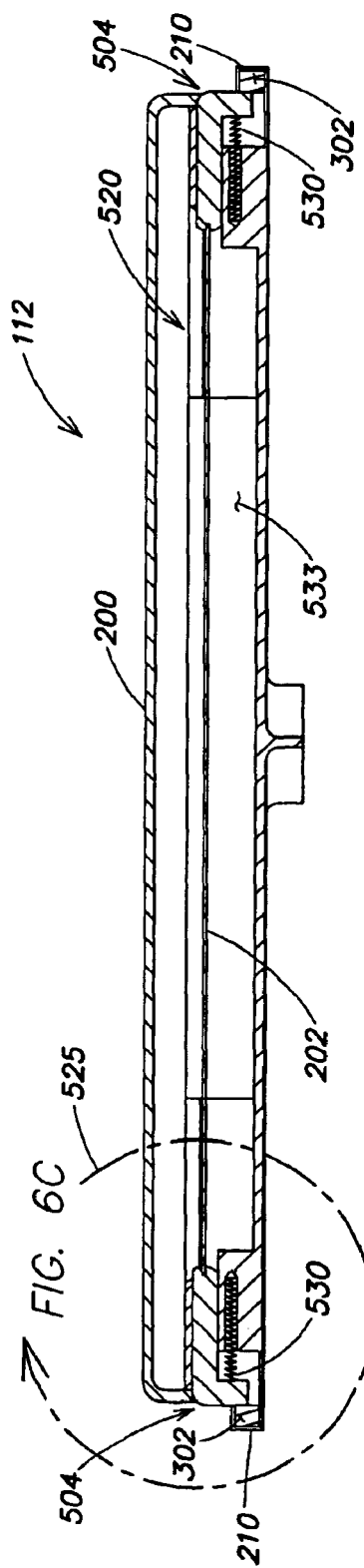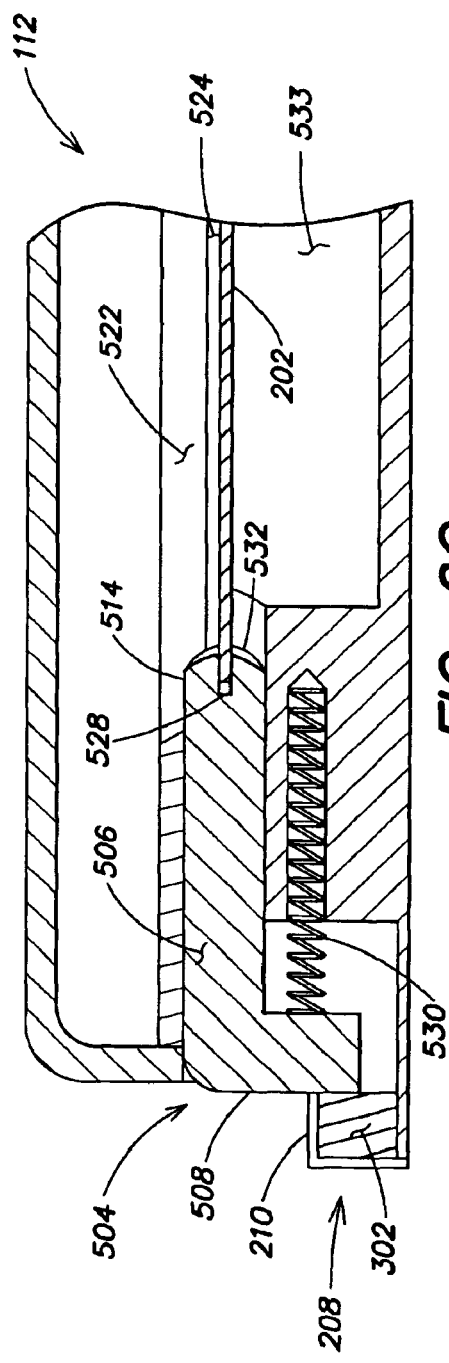

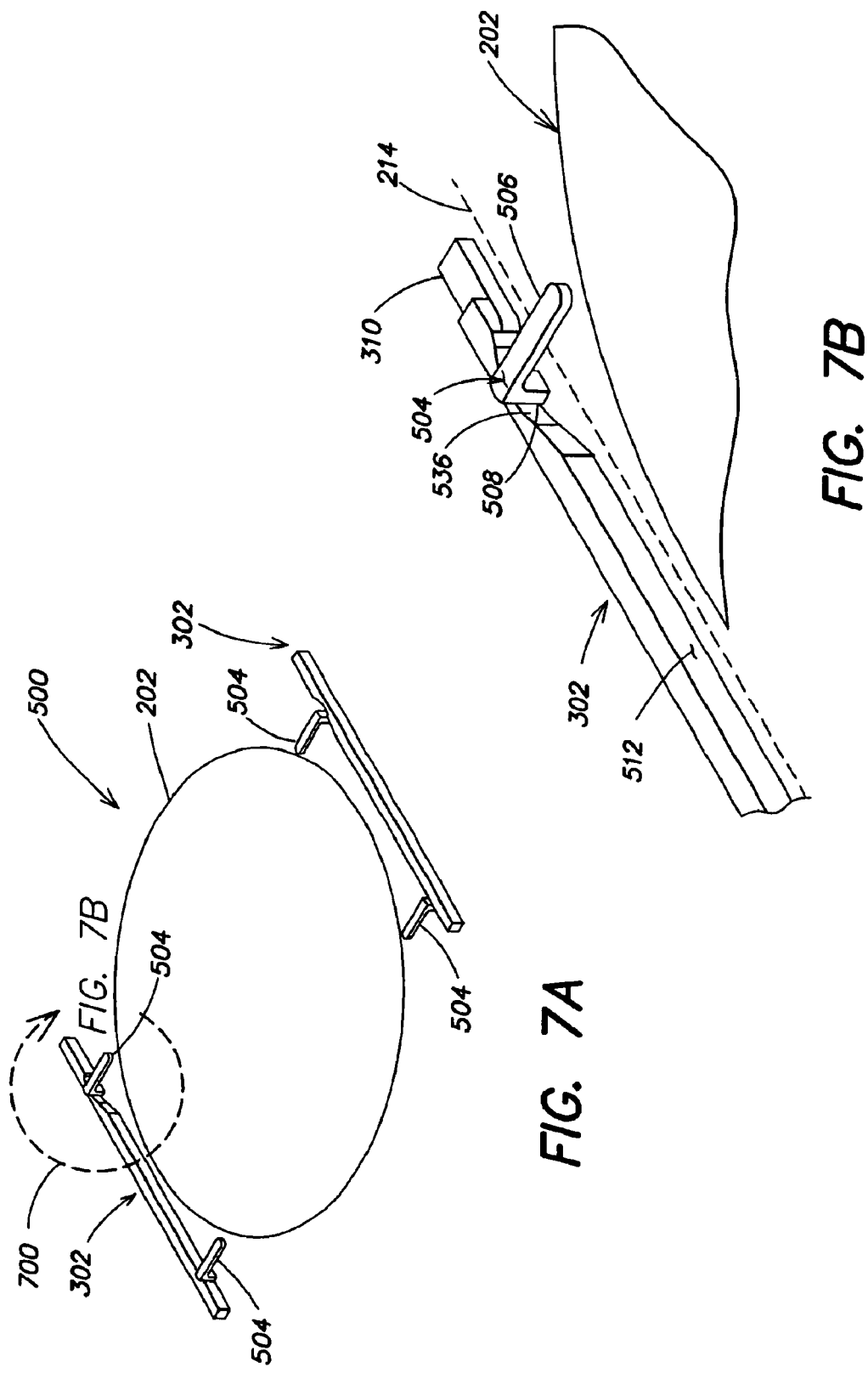

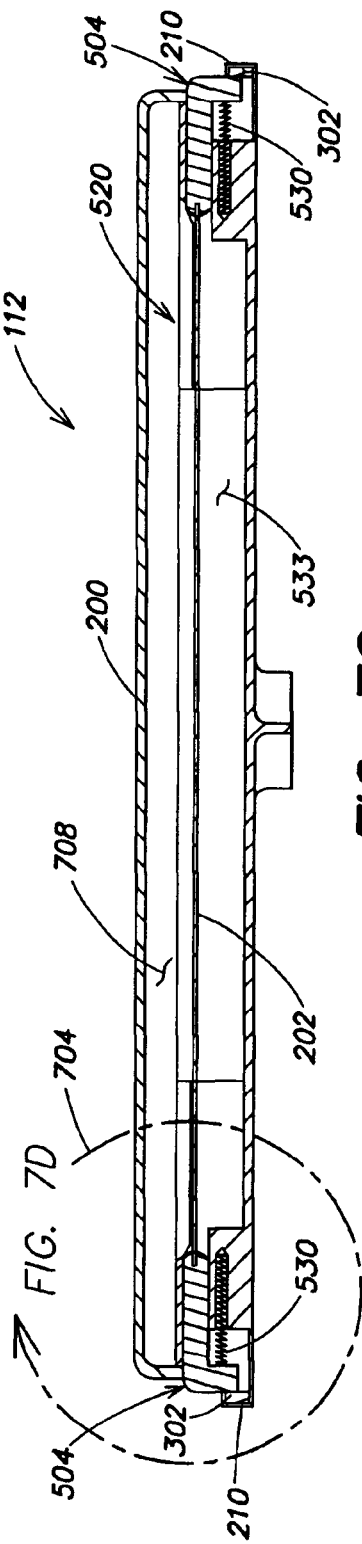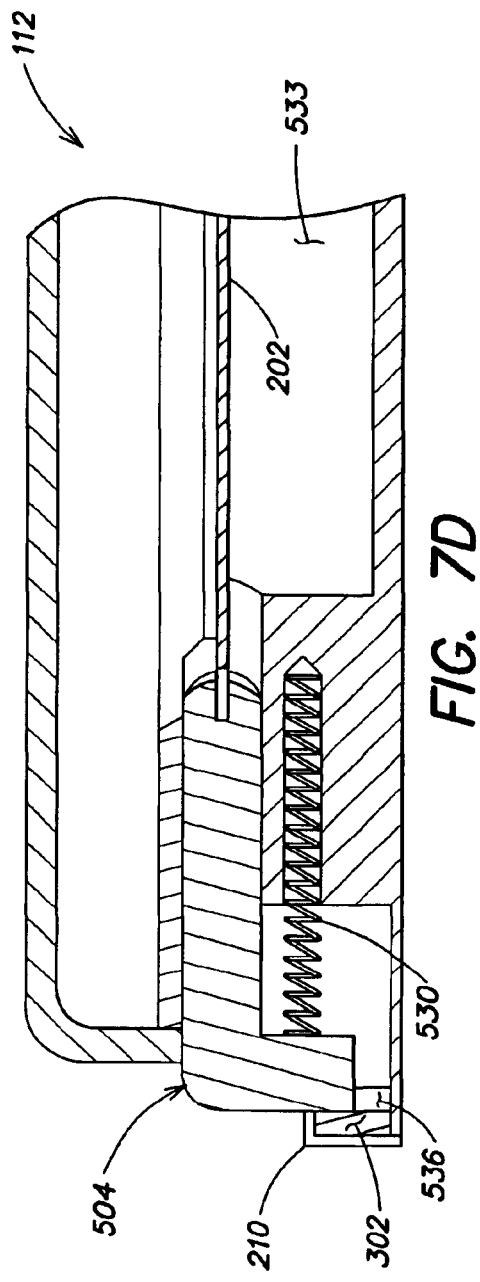

SUBSTRATE CARRIER HAVING DOOR LATCHING AND SUBSTRATE CLAMPING MECHANISMS

CROSS REFERENCE TO RELATED APPLICATIONS

This application claims priority from U.S. provisional application Ser. No. 60/407,340, filed Aug. 31, 2002, the content of which is hereby incorporated by reference herein in its entirety.

The present application is related to the following commonly-assigned, now abandoned U.S. patent applications, each of which is hereby incorporated by reference herein in its entirety:

U.S. Provisional Patent Application Ser. No. 60/407,451, filed Aug. 31, 2002 and titled "System For Transporting Wafer Carriers";

U.S. Provisional Patent Application Ser. No. 60/407,339, filed Aug. 31, 2002 and titled "Method and Apparatus for Using Wafer Carrier Movement to Actuate Wafer Carrier Door Opening/Closing";

U.S. Provisional Patent Application Ser. No. 60/407,474, filed Aug. 31, 2002 and titled "Method and Apparatus for Unloading Wafer Carriers from Wafer Carrier Transport Systems";

U.S. Provisional Patent Application Ser. No. 60/407,336, filed Aug. 31, 2002 and titled "Method and Apparatus for Supplying Wafers to a Processing Tool";

U.S. Provisional Patent Application Ser. No. 60/407,452, filed Aug. 31, 2002 and titled "End Effector Having Mechanism For Reorienting A Wafer Carrier Between Vertical And Horizontal Orientations";

U.S. Provisional Patent Application Ser. No. 60/407,337, filed Aug. 31, 2002, and titled "Wafer Loading Station with Docking Grippers at Docking Stations";

U.S. Provisional Patent Application Ser. No. 60/443,087, filed Jan. 27, 2003 and titled "Method and Apparatus for Transporting Wafer Carriers";

U.S. patent application Ser. No. 60/407,463, filed Aug. 31, 2002 and titled "Wafer Carrier Handler That Unloads Wafer Carriers Directly From a Moving Conveyor".

U.S. patent application Ser. No. 60/443,004, filed Jan. 27, 2003 and titled "Wafer Carrier Handler That Unloads Wafer Carriers Directly From a Moving Conveyor".

U.S. Provisional Patent Application Ser. No. 60/443,153, filed Jan. 27, 2003 and titled "Overhead Transfer Flange and Support for Suspending Wafer Carrier";

U.S. Provisional Patent Application Ser. No. 60/443,001, filed Jan. 27, 2003 and titled "Systems and Methods for Transferring Wafer Carriers Between Processing Tools"; and U.S. Provisional Patent Application Ser. No. 60/443,115, filed Jan. 27, 2003 and titled "Apparatus and Method for Storing and Loading Wafer Carriers".

FIELD OF THE INVENTION

The present invention relates generally to substrate processing, and more particularly to substrate carriers and apparatus and methods for interfacing the same to a processing tool.

BACKGROUND OF THE INVENTION

Semiconductor devices are formed on substrates, such as silicon substrates, glass plates or the like, often termed wafers, for use in computers, monitors, etc. These devices are formed by a sequence of fabrication steps, such as thin film deposition, oxidation, etching, polishing and thermal and lithographic processing. Although multiple fabrication steps often may be performed in a single processing apparatus, substrates typically must be transported between different processing tools for at least some of the fabrication steps required for device fabrication.

Substrates generally are stored in carriers for transfer between processing tools and other locations. In many cases substrate carriers completely enclose the substrate or substrates contained therein in a stationary volume of air or other gas, to reduce the risk of particulate contamination of the substrates. A conventional substrate carrier generally has a door that must be opened and/or removed to permit a substrate to be extracted from the substrate carrier when the substrate carrier is interfaced to a processing tool.

It may be desirable to provide a latching mechanism for a substrate carrier, to assure that the door of the carrier remains closed at times when the door is intended to be closed (e.g., during transport). It also may be desirable to provide a clamping mechanism in a substrate carrier to assure that each substrate remains stationary within the carrier housing while the carrier is being transported to or from a processing tool. Such latching and clamping mechanisms typically require numerous actuators and the use of specially designed keys which increase the cost and complexity of substrate carriers. A more simplified, cost effective substrate carrier would be advantageous.

SUMMARY OF THE INVENTION

In a first aspect of the invention, an automatic door opener is provided that includes (1) a platform adapted to support a substrate carrier; (2) a door opening mechanism adapted to open a door of the substrate carrier while the substrate carrier is supported by the platform; and (3) a tunnel. The tunnel is adapted to extend from an opening in a clean room wall toward the platform and at least partially surround the platform. The tunnel is further adapted to direct a flow of air from the clean room wall toward the platform and out of the tunnel.

In a second aspect of the invention, a method of loading a substrate into a processing tool is provided. The method includes the steps of (1) loading a substrate carrier onto a platform positioned adjacent a clean room wall that separates the platform from the processing tool; (2) at least partially surrounding the substrate carrier with a tunnel that extends from an opening in the clean room wall toward the platform; (3) opening a door of the substrate carrier while the substrate carrier is supported by the platform; and (4) directing a flow of air from the clean room wall toward the platform and out of the tunnel.

In a third aspect of the invention, an apparatus is provided for unlatching a substrate carrier. The apparatus comprises (1) a substrate transfer location including a support structure adapted to support a substrate carrier; and (2) an actuator mechanism positioned relative to the support structure. The actuator mechanism is adapted to interact with a latching mechanism of a substrate carrier supported by the support structure, so as to employ a movement of the substrate carrier to actuate unlatching of the substrate carrier.

In a fourth aspect of the invention, an apparatus is provided for releasing a substrate clamping mechanism of a substrate carrier. The apparatus comprises (1) a substrate transfer location including a support structure adapted to support a substrate carrier; and (2) an actuator mechanism positioned relative to the support structure. The actuator mechanism is adapted to interact with a substrate clamping mechanism of a substrate carrier held by the support structure, so as to employ a movement of the substrate carrier to actuate releasing of the substrate clamping mechanism.

In a fifth aspect of the invention, an apparatus is provided for unlatching a substrate carrier and for releasing a substrate clamping mechanism of the substrate carrier by employing both features of the first and second aspects of the invention. Numerous other aspects are provided, and are systems and methods for carrying out the same.

The term "latching mechanism" as used herein and in the appended claims will be understood to mean a mechanism which applies a force to a door of a substrate carrier to hold the door in a closed position. "Latching" refers to holding a door of a substrate carrier in a closed position. "Unlatching" refers to allowing a door of a substrate carrier to open (whether or not the door is actually opened).

With the apparatus and methods of the present invention, the door of a substrate carrier can be securely closed, notwithstanding gravitational or other forces that might tend to open the door. Also in accordance with the invention a substrate clamping mechanism included in a substrate carrier may assure that a substrate is maintained at a stable position within the substrate carrier during transporting of the substrate carrier. This may prevent unintended contact between the substrate and the interior of the substrate carrier, thereby reducing the possibility of particulate contamination or damage of the substrate. In accordance with one or more embodiments of the invention, these features are provided with fewer actuators or the use of specially designed keys employed with many conventional substrate carriers.

Further features and advantages of the present invention will become more fully apparent from the following detailed description, the appended claims and the accompanying drawings.

BRIEF DESCRIPTION OF THE DRAWINGS

FIG. 4A is an isometric view of a carrier opening mechanism provided in accordance with the invention as part of the substrate transfer location of FIG. 1;

FIG. 4B is an enlarged isometric view showing a portion of the view of FIG. 4A;

FIG. 5A is a schematic isometric view showing a clamping mechanism provided in accordance with the invention and included in the substrate carrier of FIGS. 2A–2B;

FIG. 5B is an enlarged schematic isometric view showing a portion of the view of FIG. 5A;

FIG. 5D is a magnified isometric view, showing details of a portion of FIG. 5C;

FIG. 6B is a cross sectional view of the substrate carrier of FIG. 5C wherein an alternative clamping member configuration is employed;

FIG. 6C is a magnified isometric view showing details of a portion of FIG. 6B;

FIGS. 7A and 7B respectively are views similar to FIGS. 5A and 5B, showing the inventive substrate clamping mechanism in a released condition;

FIG. 7C is a cross sectional view similar to FIG. 6B, but with the clamping members retracted;

FIG. 7D is a magnified isometric view showing details of a portion of FIG. 7C;

DETAILED DESCRIPTION

In accordance with the present invention, a door latching mechanism of a substrate carrier is automatically unlatched by interaction of the latching mechanism with an actuator mechanism at a substrate transfer location (e.g., of a processing tool that may be used, for example, during semiconductor device manufacturing). The same actuator mechanism also may release a substrate clamping mechanism that may be part of the substrate carrier (e.g., and that secures a substrate stored by the substrate carrier during transport).

Figure 1:
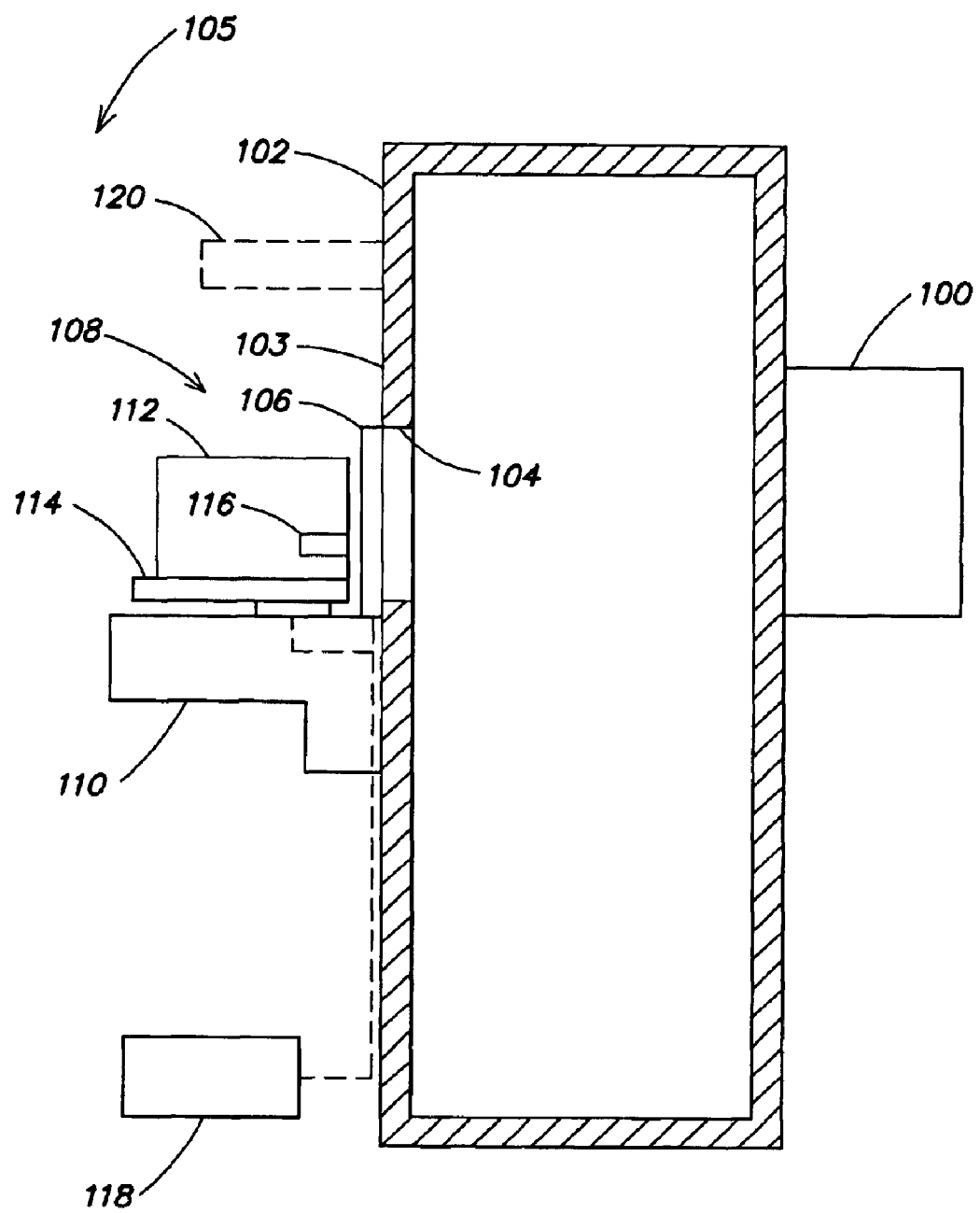
FIG. 1 is a schematic side elevational view showing a substrate transfer location provided in accordance with the invention.

FIG. 1 is a schematic side elevational view which shows a processing tool and an associated factory interface that includes a substrate transfer location provided in accordance with the invention. In FIG. 1, reference numeral 100 indicates a schematic representation of a processing tool.

As is familiar to those who are skilled in the art, the processing tool 100 may include one or more load locks, one or more transfer chambers, and/or one or more processing chambers associated with the one or more transfer chambers. None of these features are separately shown. It will be appreciated that, in the processing chambers, one or more semiconductor device fabrication processes may be applied to substrates that are loaded into the processing tool 100.

A factory interface (FI) 102 is coupled to the processing tool 100 to provide an interface between the processing tool 100 and one or more substrate carriers that contain substrates to be loaded into the processing tool 100. The factory interface 102 includes a clean room wall 103 which separates the interior of the factory interface 102 from a clean room environment 105. The factory interface 102 includes a port 104 through which one or more substrates may be transferred into the factory interface 102. More than one port 104 may be employed. An optional door 106 may selectively close the port 104 of the factory interface 102. (In one embodiment of the invention, the door 106 shown in FIG. 1 may be dispensed with, and the factory interface 102 may have a positive interior pressure such that a constant flow of gas exits the factory interface 102 through the port 104. The positive interior pressure of the factory interface 102 thereby acts to deter particles/contaminants from entering the factory interface 102.) A positive static pressure may be maintained within the factory interface 102, for example, via a flow of filtered air through the factory interface (e.g., from a top of the factory interface to a bottom of the factory interface) and with the use of HEPA, ULPA or similar cleanroom grade filters known in the art. In one embodiment of the invention, a 0.005–0.2 inches of water pressure differential between the inside and outside of the factor interface 102 may be employed (e.g., using recirculated, filtered ambient air).

A substrate transfer location 108 is provided in accordance with the invention outside the factory interface 102 (e.g., at an outer side of the door 106 and the port 104). The substrate transfer location 108 includes a substrate carrier support structure such as a support platform 110, on which an inventive substrate carrier 112 (described further below) may be supported.

Associated with the support platform 110 is a carrier moving mechanism 114, such as a motorized stage or pneumatic cylinder, which is adapted to move the substrate carrier 112 toward and away from the port 104 of the factory interface 102. It will be understood that alternatively a substrate carrier may be supported via a gripper (not shown) that grips the substrate carrier, for example, via an overhead transfer flange (not shown) of the substrate carrier to thereby suspend the substrate carrier. Either the gripper or the support 110 may include one or more kinematic features (e.g., kinematic pins, mounts or the like) to aid in substrate carrier positioning.

In FIG. 1, reference numeral 116 schematically represents a door or openable portion of the substrate carrier 112. Not separately shown in FIG. 1 are an actuator mechanism (described below) included in the substrate transfer location 108, and a latching mechanism (described below) provided on the substrate carrier 112. In accordance with at least one embodiment of the invention, a motion of the substrate carrier 112 causes the actuator mechanism of the substrate transfer location 108 to interact with the latching mechanism of the substrate carrier 112 to unlatch the openable portion 116 of the substrate carrier 112. The interaction of the actuator mechanism of the substrate transfer location 108 and the latching mechanism of the substrate carrier 112 also may serve to release a substrate clamping mechanism (not shown in FIG. 1) of the substrate carrier 112. The actuator mechanism of the substrate transfer location 108, and the latching mechanism and the substrate clamping mechanism of the substrate carrier 112 are described further below with reference to FIGS. 2A–7E.

The factory interface 102 may also include a substrate handling robot, which is not shown, and which is adapted to transfer substrates between the substrate carrier 112 and the processing tool 100.

In the embodiment of FIG. 1, a controller 118 is coupled to the door 106 of the factory interface 102 and to the carrier moving mechanism 114 to control operation thereof.

Reference numeral 120 represents one or more substrate carrier storage shelves (for storing one or more substrate carriers) that may be mounted in association with the substrate transfer location 108. For example, the one or more substrate carrier storage shelves 120 may be located above the substrate transfer location 108 as shown.

Figure 2B:
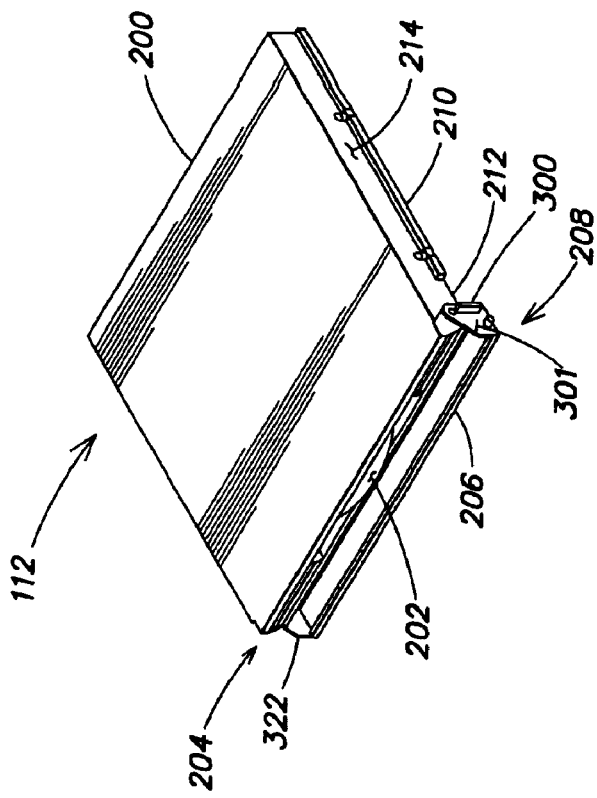
FIGS. 2A and 2B are isometric views of a substrate carrier provided in accordance with the present invention, respectively showing the inventive substrate carrier in a closed condition and in an open condition.
Figure 2A:
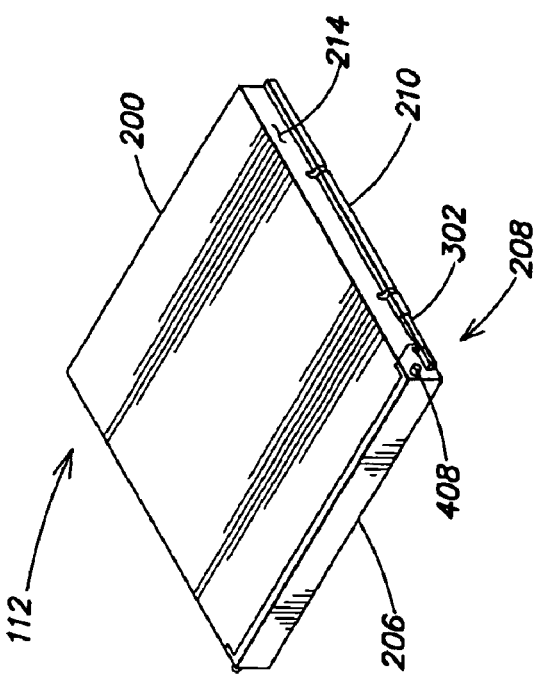

FIG. 2A is an isometric view of the inventive substrate carrier 112 of FIG. 1, in a closed condition, and FIG. 2B is a view similar to FIG. 2A, showing the inventive substrate carrier 112 in an opened condition. The inventive substrate carrier 112 includes a carrier housing 200, in which a substrate 202 (FIG. 2B) may be contained. The carrier housing 200 includes an openable portion 204 including a door 206 which is pivotally mounted to the carrier housing 200. The door 206 pivots between the closed position shown in FIG. 2A and the opened position shown in FIG. 2B.

In accordance with the invention, the inventive substrate carrier 112 includes a latching mechanism 208. In at least one embodiment, the inventive latching mechanism 208 may comprise an elongated, tube-like enclosure 210 arranged along a sidewall 214 of the carrier housing 200, preferably along a lower edge 212 thereof (although other locations may be employed). The enclosure 210 may, for example, have a square or rectangular cross section. Other shapes may be employed. The enclosure 210 may, for example, be integrally formed with or separately formed from the carrier housing 200.

Figure 2C:
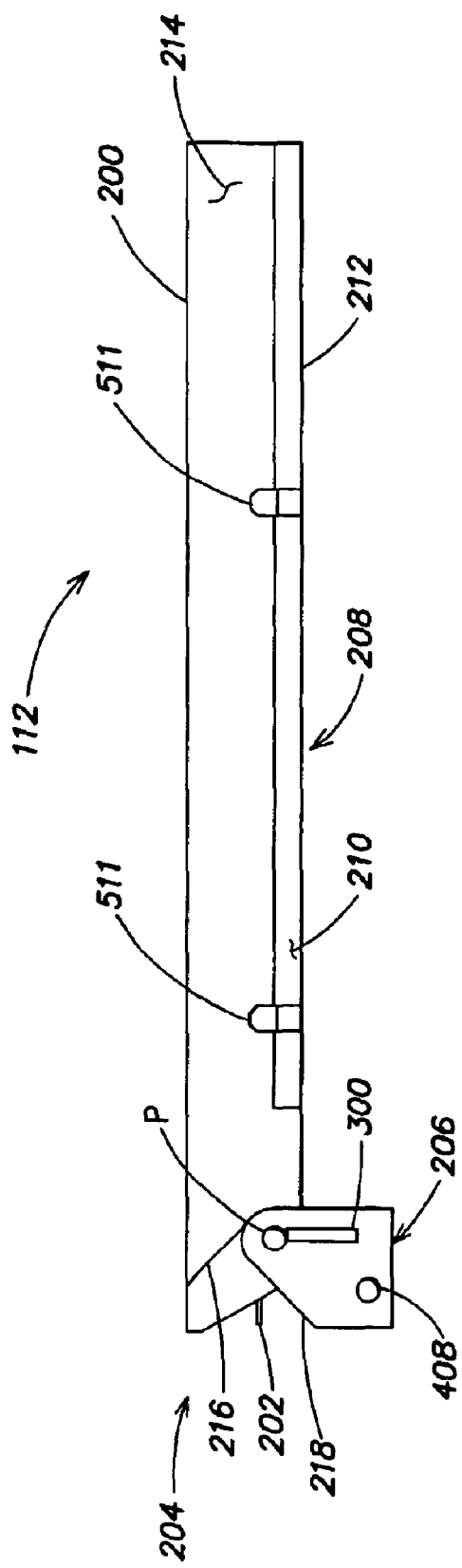
FIG. 2C is a side view of the substrate carrier of FIG. 2B.

As shown in the side view of FIG. 2C, the openable portion 204 of the carrier housing 200 may have an angled face 216 (e.g., 45° or some other suitable angle) and the door 206 may have a complimentary angled face 218 so that when the door 206 closes, it does so without scrubbing action relative to the openable portion 204 of the carrier housing. Consequently, the likelihood of generating particles upon closing of the door 206 may be reduced. One or both of the angled faces 216, 218 may be covered with an elastomeric material, such as silicone, to affect sealing therebetween.

Figure 3:
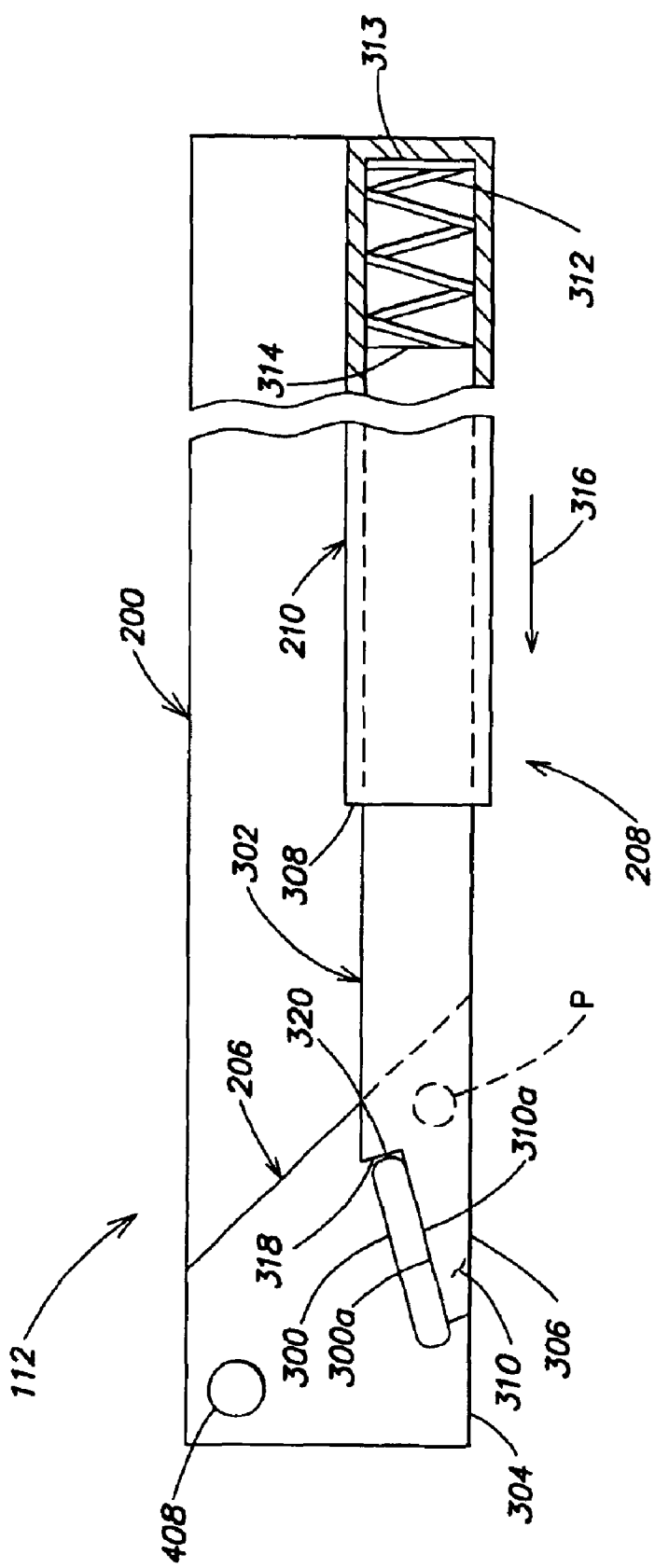
FIG. 3 is an enlarged partial side view showing some of the components of the inventive substrate carrier of FIGS. 2A–2B when the inventive substrate carrier is in a closed and latched condition.

FIG. 3 is a partial side elevational view of the inventive substrate carrier 112, showing details of an exemplary embodiment of the inventive latching mechanism 208. The latching action of the latching mechanism 208 is provided by interaction between a tab 300 which extends outwardly from a right side 301 (FIG. 2B) of the door 206 and a latch member 302 that is slidable within the enclosure 210. In the example shown, the tab 300 is positioned above a lower edge 304 (FIG. 3) of the door 206. The latch member 302 has an outer end 306 that extends outwardly from a mouth 308 of the enclosure 210. The latch member 302 includes a finger 310 that extends outwardly from the outer end 306 of the latch member 302. The finger 310 is configured so that when the latching mechanism 208 is in its latching condition, as shown in FIG. 3 and as described further below, the door 206 is closed (FIGS. 2A and 3) and the finger 310 of the latch member 302 underlies the tab 300. In this position, the finger 310 prevents the tab 300 (and thus the door 206) from pivoting about a pivot point P relative to the carrier housing 200 (e.g., by applying an upward force on the tab 300 to keep the door 206 in a closed position). Specifically, a portion 310a of the finger 310 contacts a portion 300a of the tab 300 as shown in FIG. 3.

In at least one embodiment of the invention, the portion 300a of the tab 300 and/or the portion 310a of the finger 310 are sloped relative to a horizontal plane (e.g., at about 10–15°, although other or no angles may be employed). Sloping the portion 310a of the finger 310 provides a vertical force component that may help seal the substrate carrier 112. Sloping the portion 300a of the tab 300 may reduce particle generation and/or wear of the tab 300 and/or the finger 310 by more evenly distributing frictional contact across the surfaces of the tab 300 and finger 310. A low friction coating or contact surface (not shown) also may be added to the tab 300 and/or the finger 310 to reduce frictional interaction between the tab 300 and finger 310 during opening and/or closing of the substrate carrier 112. Examples of such a low friction coating/contact surface include polytetrafluoroethylene (PTFE) or Teflon®, a PTFE-like material, other low friction and/or low particle generating materials, etc.

The latching mechanism 208 also includes a biasing mechanism such as a spring 312. The spring 312 is held in an inner end 313 of the enclosure 210 (e.g., the end opposite to the mouth 308 of the enclosure 210). The spring 312 pushes against an inner end 314 of the latch member 302 to bias the latch member 302 outwardly (in the direction indicated by arrow 316) toward the tab 300 of the door 206 (e.g., toward the latching position illustrated in FIG. 3). Other suitable biasing mechanisms may be similarly employed.

A step 318 is formed on the outer end 306 of the latch member 302 at a point where the finger 310 emerges from the outer end 306. When the latching mechanism 208 is in its latching position shown in FIG. 3, the step 318 of the latch member 302 abuts a side 320 of the tab 300 to limit the outward movement of the latch member 302.

Referring again to FIGS. 2A and 2B, although only one latching mechanism 208, associated with the side wall 214 of the carrier housing 200, is shown in the drawings, it is also contemplated that a second latching mechanism may be provided in association with an opposite side wall of the carrier housing 200 to latch a left side 322 (FIG. 2B) of the door 206.

FIG. 4A is an isometric view of one exemplary embodiment of a carrier opening mechanism 400 configured in accordance with the present invention. In the exemplary embodiment, the carrier opening mechanism 400 may be positioned adjacent, or even within, the port 104 of the factory interface 102. In general, the carrier opening mechanism 400 may be employed at any location in which access to the substrate 202 of the substrate carrier 112 is desired.

Referring to FIG. 4A, the carrier opening mechanism 400 is shown as it would be seen looking outward from the interior of the factory interface 102 (FIG. 1) through the port 104 toward the substrate transfer location 108. FIG. 4B is an enlarged isometric view showing details of a portion 401 (FIG. 4A) of the carrier opening mechanism 400. As shown in FIGS. 4A, 4B the carrier opening mechanism 400 is generally in a shape that matches the substrate carrier 112's profile and provides a small clearance for clean air flow around the substrate carrier 112 as further described below and as represented, for example, by a rectangular tunnel 402. Other configurations may be employed. For example, the carrier opening mechanism 400 may comprise two side pieces having actuating mechanisms (such as those described further below) coupled adjacent the port 104.

With reference to FIG. 4B, a cam slot 404 is formed in a side wall 406 of the tunnel 402. As more fully described in previously incorporated U.S. patent application Ser. No. 60/407,339, filed Aug. 31, 2002 and titled "Method and Apparatus for Using Wafer Carrier Movement to Actuate Wafer Carrier Door Opening/Closing", the door 206 of the substrate carrier 112 may be provided with a cam follower 408 (FIGS. 2A, 2C and 3) that cooperates with the cam slot 404 of the carrier opening mechanism 400 to guide the door 206 to the opened position shown in FIGS. 2B and 2C.

As described in the above-referenced co-pending patent application, opening of the door 206 may occur by means of a docking movement of the substrate carrier 112 relative to the port 104. As used herein, "docking" or docking movement refers to the inward motion of a substrate carrier toward a port through which substrates are exchanged, such as a port in a clean room wall. Similarly, "undocking" or undocking movement refers to outward motion of a substrate carrier away from a port through which substrates are exchanged, such as a port in a clean room wall. Arrow 410 in FIG. 4B schematically represents such a docking movement.

As shown in FIG. 4B, a stop 412 is positioned adjacent the side wall 406 and the cam slot 404 of the tunnel 402 in a carved-out region 413 of the side wall 406. The carved-out region 413 is configured to accommodate the latching mechanism 208 (which protrudes from the side walls of the carrier housing 200 as shown in FIGS. 2A–2C). Also shown in FIGS. 4A–4B are the carrier moving mechanism 114 (e.g., a sled) juxtaposed with the carrier opening mechanism 400, and a kinematic pin 414 provided on the carrier moving mechanism 114 to interact with an alignment feature (not shown) on the bottom of the substrate carrier 112 (FIG. 1) to guide the substrate carrier 112 into a correct position on the carrier moving mechanism 114. Typically a plurality of kinematic features (e.g., three or more) may be employed to aid in positioning the substrate carrier 112 relative to the carrier moving mechanism 114. A step 416 is provided adjacent the stop 412 of the carrier opening mechanism 400 for providing structure to the stop 412 and for controlling air flow around the substrate carrier 112 and/or the carrier moving mechanism 114 (as described further below). It will be understood that the opposite side wall (e.g., side wall 418) of the carrier opening mechanism 400 may be similarly configured with a cam slot, carved-out region configured to accommodate a latching mechanism provided on the side of the substrate carrier 112 opposite side 214 in FIGS. 2A–2C, a stop and/or a step.

The stop 412 functions as an actuating mechanism to interact with the latching mechanism 208 of the substrate carrier 112 (FIG. 3). (An additional port stop, not shown in the drawings, provided at side wall 418 (FIG. 4A) of the tunnel 402 may interact with a second latching mechanism (not shown) of the substrate carrier 112.) In particular, as a result of a docking movement of the substrate carrier 112, the finger 310 (FIG. 3) of the latch member 302 comes into contact with the stop 412. The substrate carrier 112 may or may not contact the step 416 during docking. As the substrate carrier 112 continues to move in the direction indicated by the arrow 410 (FIG. 4B), motion of the latch member 302 in that direction is halted by the stop 412, causing the latch member 302 to be pushed into the enclosure 210 against the biasing force of the spring 312. As a result, the tab 300 is released from the finger 310 of the latch member 302, allowing the door 206 to pivot (about point P (FIG. 3)) and to be opened by the above-referenced interaction of the cam slot 404 (FIG. 4B) and the cam follower 408 (FIG. 3).

Figure 4C:
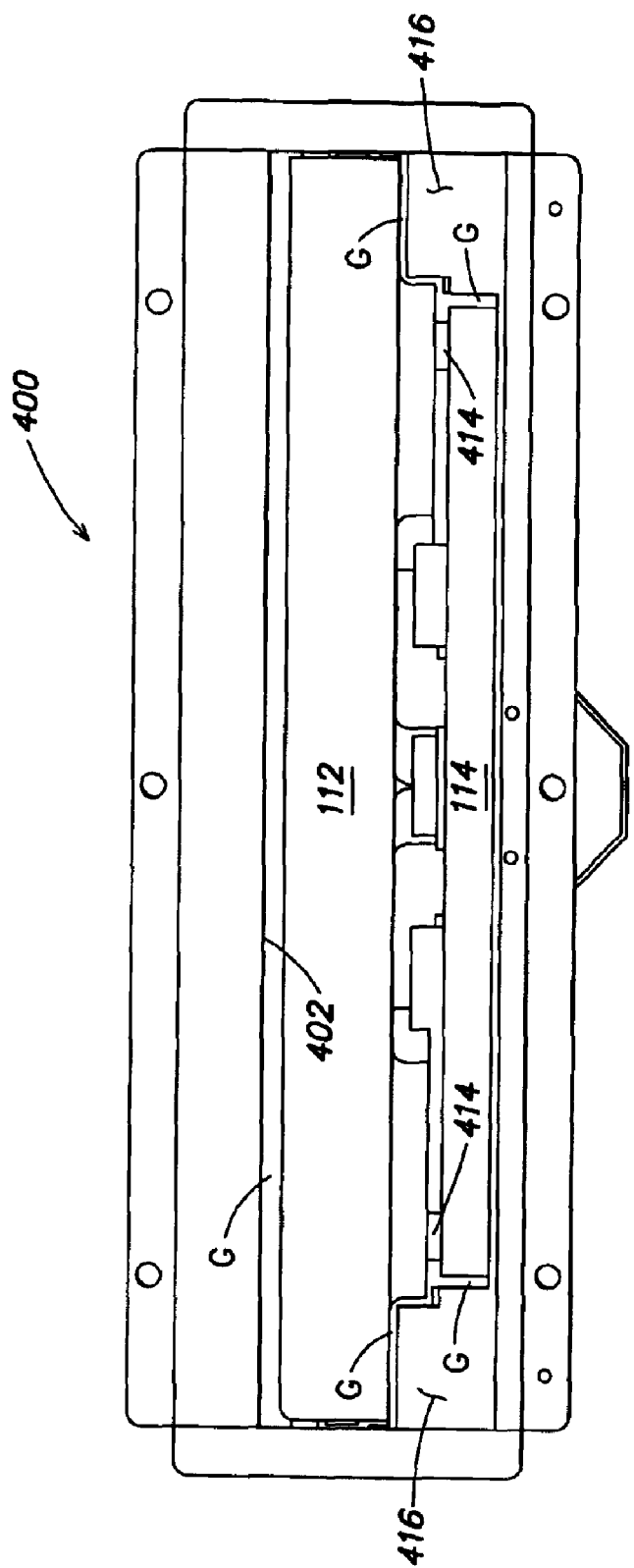
FIG. 4C is a front plan view of the carrier opening mechanism of FIG. 4A having the substrate carrier of FIGS. 2A–2C positioned therein.

FIG. 4C is a front plan view of the carrier opening mechanism 400 of FIG. 4A having the substrate carrier 112 positioned therein. As shown in FIG. 4C, the step 416 may assist in reducing excessive air flow from the factory interface 102 (FIG. 1) through the port 104 and the carrier opening mechanism 400 by providing a controlled air gap G between the carrier opening mechanism 400 and the substrate carrier 112 and the carrier moving mechanism 114 (e.g., so as to establish a laminar air flow therebetween). Such a laminar flow may be generated, for example, by providing an air gap G of between about 0.05 to 0.150 inches. Other air gap spacings may be employed.

As stated above, positive static pressure may be maintained within the factory interface 102, for example, via a flow of filtered air through the factory interface (e.g., from a top of the factory interface to a bottom of the factory interface) and with the use of HEPA, ULPA or similar cleanroom grade filters known in the art. In one embodiment of the invention, a 0.005–0.2 inches of water pressure differential between the inside and outside of the factory interface 102 may be employed (e.g., using recirculated, filtered ambient air).

In one or more other aspects of the invention, the door 106 (FIG. 1), also referred to herein as a "port door", may include keys (not shown) or other unlocking and/or door opening mechanisms for unlocking, receiving and supporting the door 116 of the substrate carrier 112 as described, for example, in U.S. Pat. No. 6,082,951 titled "Wafer Cassette Load Station" which is hereby incorporated by reference herein in its entirety. The door 106 may move backward away from the platform 110 and then lower, carrying the door 116 of the substrate carrier 112 therewith as is generally known; alternatively the door 106 may lack any x-axis movement and the platform 110 instead may move the substrate carrier 112 away from the port 104 (or other similar opening in the clean room wall 103) so that the door 106 may lower (supporting the door 116 of the substrate carrier 112) without contacting the substrate carrier 112 as described in above-identified U.S. Pat. No. 6,082,951. The platform 110 then may move the substrate carrier 112 back toward the port 104 (e.g., to allow a substrate to be removed therefrom). In either case, in accordance with the present invention, the substrate carrier 112 may remain within the tunnel 402 and receive a flow of air (e.g., a laminar flow) from the factory interface 102 as described above.

The laminar flow of air tends to prevent particles from reaching the locus at which a substrate is withdrawn from the substrate carrier 112 to be transferred to the processing tool 100. Note that such a laminar air flow and/or positive pressure factory interface arrangement may be employed with any substrate carrier (e.g., a single substrate carrier, a multiple-substrate carrier, a front opening substrate carrier, a front opening unified pod, etc.) and with any substrate carrier door arrangement, whether or not substrate carrier movement is employed to open and/or close a substrate carrier door. For example, the present invention may be employed to surround an opening through which substrates are transferred between an open substrate carrier and a processing tool, so as to generate a laminar air flow from the processing tool side past the open substrate carrier (e.g., and out of the tunnel 402).

A substrate clamping mechanism that may be included in the inventive substrate carrier 112 will now be described with reference to FIGS. 5A–7E.

FIG. 5A is a schematic isometric view of an exemplary substrate clamping mechanism 500 provided in accordance with the invention. FIG. 5B is a magnified isometric view, showing details of a portion 502 of FIG. 5A.

The inventive substrate clamping mechanism 500 operates by interaction of clamping members 504 with latch members 302 of the kind described above in connection with the latching mechanism 208 (FIG. 3). In one embodiment of the invention, as shown in FIG. 5A, four clamping members 504 are provided, comprising two pairs of clamping members 504, with each pair of clamping members 504 associated with a respective latch member 302. Other numbers of clamping members may be employed.

Figure 5C:
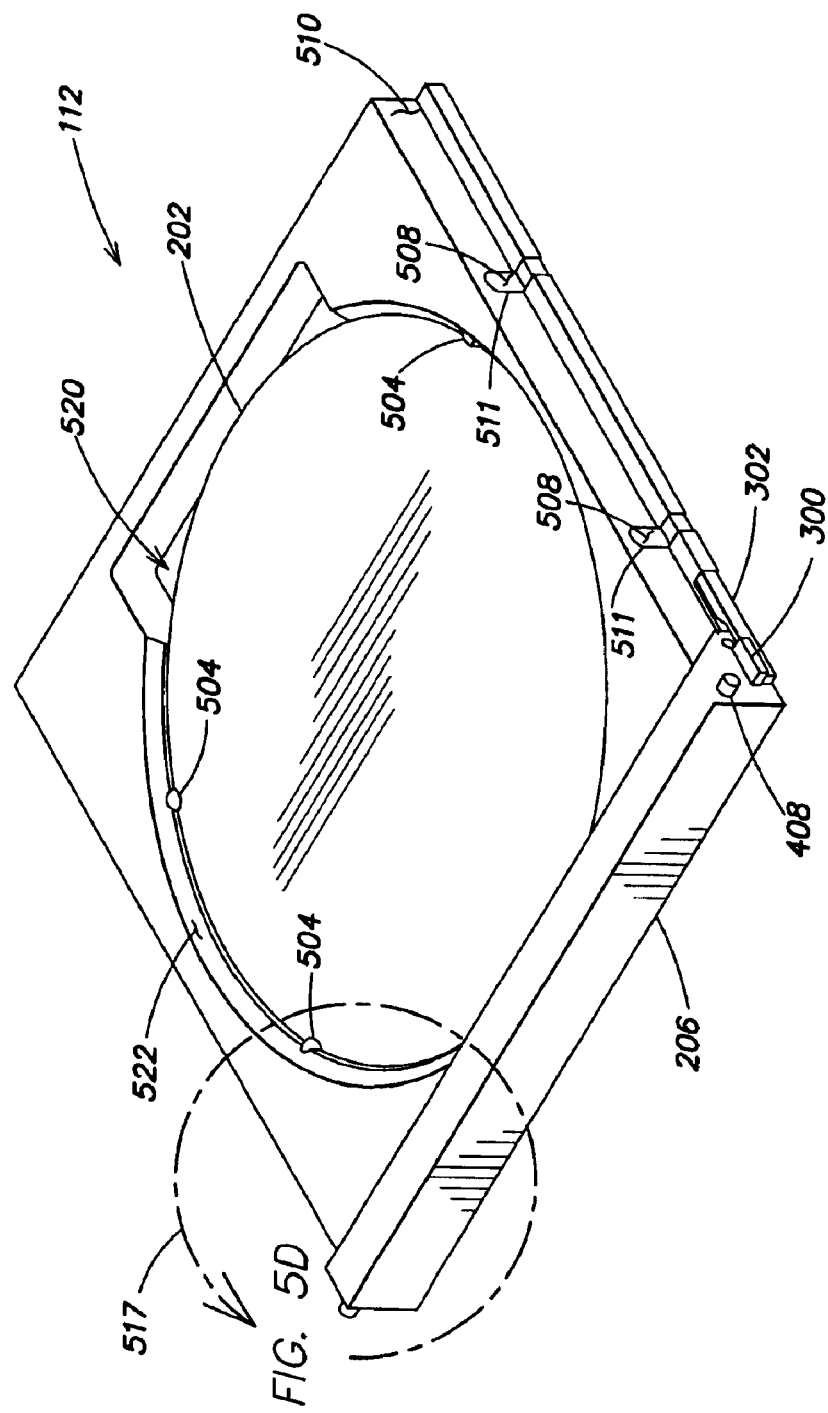
FIG. 5C is an isometric view of an embodiment of the substrate carrier of FIGS. 2A–2B wherein a lid of the substrate carrier is removed and clamping members are clamping a substrate.

Referring to FIG. 5B, in one embodiment of the invention each clamping member 504 is generally L-shaped, having a horizontal leg 506 and a relatively short vertical leg 508. Other shapes/configurations may be employed. In FIG. 5B, a side wall of the carrier housing 200 (FIGS. 2A–2C) is schematically represented by a dashed line 214. Each clamping member 504 may be slidably mounted in a respective aperture 511 (FIG. 2C and FIG. 5C described below) of the side wall 214 of the carrier housing 200.

When the substrate clamping mechanism 500 is in its clamping condition, as illustrated in FIGS. 5A, 5B, an inner side 512 of the latch member 302 contacts the vertical leg 508 of the clamping member 504 and holds the clamping member 504 such that an end 514 of the horizontal leg 506 of the clamping member 504 contacts an edge 516 of the substrate 202. Simultaneous contact of all four clamping members 504 with the substrate 202 serves to clamp the substrate 202 (e.g., so as to hold the substrate 202 stationary, particularly during transport of the substrate carrier 112).

FIG. 5C is an isometric view of an embodiment of the substrate carrier 112 wherein a lid (not shown) of the substrate carrier 112 is removed. FIG. 5D is a magnified isometric view, showing details of a portion 517 of FIG. 5C. In the embodiment of FIGS. 5C and 5D, the substrate carrier 112 includes a hollowed out region 520 having an angled side wall portion 522 and a non-angled side wall portion 524 (FIG. 5D). The non-angled side wall portion 524 has a diameter approximately equal to that of the substrate 202 (e.g., about 0.004 to 0.005 inches larger than the substrate 202 in one embodiment, although other dimensions may be employed), and the angled side wall portion 522 is angled so as to ensure accurate positioning of the substrate 202 as the substrate 202 is lowered into the non-angled side wall portion 524 of the substrate carrier 112. In at least one embodiment, the angled side wall portion 522 has an angle of about 45° from the plane of the substrate 202, although other angles may be employed.

In FIGS. 5C and 5D, the clamping members 504 are shown in a clamping position; and the latch member 302 is extended below the tab 300 of the door 206 so as to hold the door 206 in a closed position as previously described (and as shown in FIG. 5C). As further shown in FIG. 5C, in the clamping position, the latch member 302 presses against the vertical leg 508 of each clamping member 504 so as to press each clamping member 504 through the apertures 511 into contact with the substrate 202.

Figure 6A:
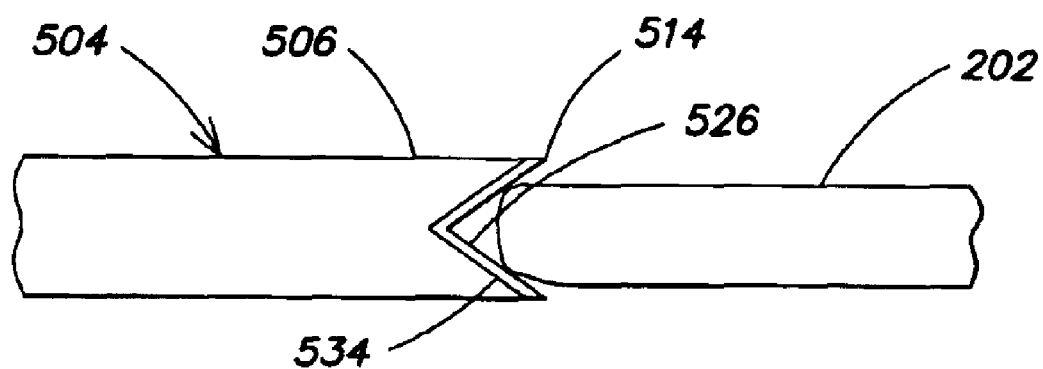
FIG. 6A is a partial side view showing a clamping member of the clamping mechanism of FIGS. 5A and 5B in clamping contact with a substrate.

FIG. 6A is a partial side view showing contact between one of the clamping members 504 and the substrate 202. As seen from FIG. 6A, contact with the substrate 202 may be made via a V-shaped groove 526 formed in the end 514 of the horizontal leg 506 of the clamping member 504. Other configurations than a V-shaped groove may be employed to contact the substrate 202. For example, FIG. 6B is a cross sectional view of the substrate carrier 112 of FIG. 5C, and FIG. 6C is a magnified isometric view showing details of a portion 525 of FIG. 6B, wherein the clamping members 504 have a flat groove 528 in the end 514 of the horizontal leg 506. As stated, other configurations may be employed to provide effective clamping of the substrate 202. As further shown in FIGS. 6B and 6C, the vertical leg 508 of each clamping member 504 is biased against the latch member 302 (e.g., via a spring 530 or another suitable biasing mechanism).

To protect the substrate 202 from damage due to contaminants generated by the latching mechanism 208 and/or due to contact between the substrate 202 and the clamping members 504 (1) a membrane (e.g., a flexible membrane 532, such as a diaphragm in FIG. 6C) may be employed to isolate the latching mechanism 208 from a clean substrate area 533 of the substrate carrier 112 in which the substrate 202 is located (as shown in FIGS. 6B and 6C); and/or (2) the end 514 of each clamping member 504 may be provided with a "soft face" 534 for contacting the substrate 202 (as shown in FIG. 6A). For example, the flexible membrane 532 may isolate the substrate 202 from all of the moving parts of the latching mechanism 208 that may generate particles (e.g., the latch member 302, the clamping members 504, the springs 530, etc.). The flexible membrane 532 and/or the soft face 534 may comprise, for example, a urethane, silicone, etc.

Referring again to FIG. 5B, a notch 536 is formed in the side 512 of the latch member 302. When the substrate clamping mechanism 500 is in its clamping position as shown in FIG. 5B, the notch 536 is positioned a predefined distance in a forward direction relative to the clamping member 504 (as described further below). A similar notch, which is not shown, is similarly positioned relative to the other clamping member 504 associated with the latch member 302 of FIG. 5B. Moreover, similar notches (not shown) are provided in the other latch member 302 (FIG. 5A and FIG. 6B), and are similarly positioned relative to the clamping members 504 associated with the other latch member 302.

FIGS. 7A and 7B are views that are respectively similar to FIGS. 5A and 5B, but showing the substrate clamping mechanism 500 in a released (non-clamping) condition. FIG. 7B is a magnified view showing details of a portion 700 of FIG. 7A.

With reference to FIGS. 5A and 5B and FIGS. 7A and 7B, releasing of the clamping mechanism 500 occurs as follows. A docking movement of the substrate carrier 112 is performed relative to the port 104 (FIG. 1). That is, the carrier housing 200 (represented by side wall 214 in FIGS. 5B and 7B), the latch members 302, the clamping members 504 and the substrate 202 are moved together in the direction indicated by arrow 702 in FIG. 5B (or arrow 410 in FIG. 4B). With reference to FIG. 5B, during the docking movement, the finger 310 of the latch member 302 comes into contact with the stop 412 of the carrier opening mechanism 400 (FIG. 4B). Accordingly, motion of the latch member 302 in the direction indicated by the arrow 702 is halted. The clamping member 504 advances along the latch member 302 until it reaches the notch 536. A biasing arrangement such as the spring 530 of FIGS. 6B and 6C may be employed to cause the clamping member 504 to enter the notch 536 so that the clamping member 504 moves away from, and out of contact with, the substrate 202. All four of the clamping members 504 (FIG. 5A) may move substantially simultaneously out of contact with the substrate 202 in a similar manner, thereby releasing the substrate 202 from clamping. (As an alternative to the above-mentioned biasing arrangement, the clamping member 504, and in particular the vertical leg 508 thereof, may be coupled to the latch member 302 by a tongue-in-groove arrangement or other similar caming arrangement so that the clamping member 504 is drawn into the notch 536 and away from the substrate 202.)

Figure 7E:
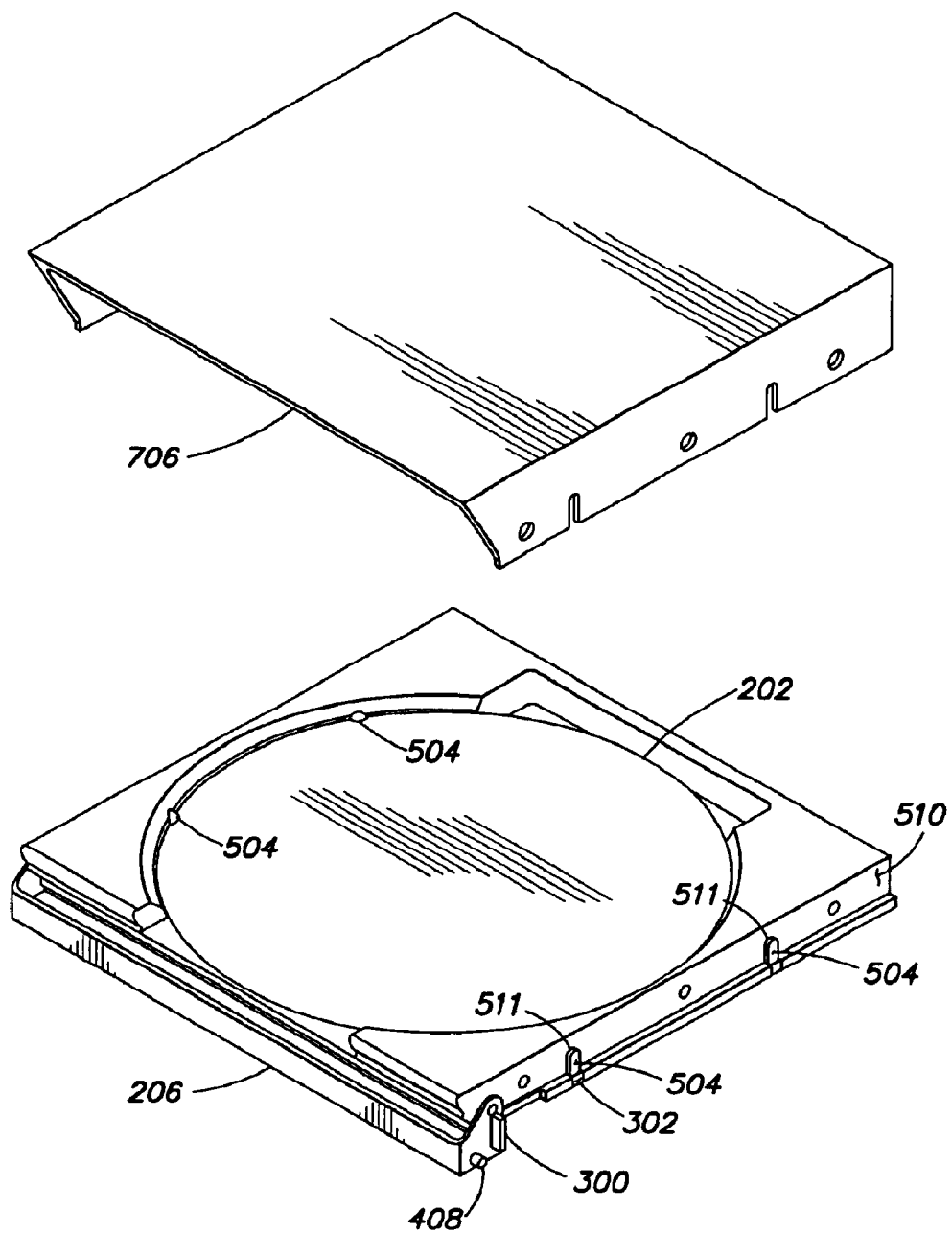
FIG. 7E is an isometric view of an embodiment of the substrate carrier wherein a lid of the substrate carrier is removed and clamping members are retracted from a substrate.

FIG. 7C is a cross sectional view similar to FIG. 6B, but with the clamping members 504 retracted into the notches 536 of each latch member 302; FIG. 7D is a magnified isometric view showing details of a portion 704 of FIG. 7C; and FIG. 7E is an isometric view of an embodiment of the substrate carrier 112 wherein a lid 706 of the substrate carrier 112 is removed. As shown in FIGS. 7C–7E, as the substrate carrier 112 moves forward relative to each latch member 302, the spring 530 biases each clamping member 504 against the latch 302 so that each clamping member 504 enters its respective notch 536 by retracting away from the substrate 202 through aperture 511. The substrate 202 thereafter may be extracted from the substrate carrier 112 as described below.

With reference to FIGS. 1–7E, in operation, a substrate carrier 112, containing the substrate 202 to be processed in the processing tool 100, is placed on the support platform 110 of the substrate transfer location 108 by, for example, a carrier handler robot (not shown) associated with the factory interface 102. The controller 118 causes the door 106 (if present) to be opened, and causes the carrier moving mechanism 114 to dock the substrate carrier 112 with the port 104. The docking movement of the substrate carrier 112 brings the fingers 310 (FIG. 3) of the latch members 302 into contact with stops 412 (FIG. 4B, only one shown) of the tunnel 402. As the substrate carrier 112 continues to advance, the latch members 302 are disengaged from the tabs 300 (only one shown, FIG. 3) and pushed into the enclosures 210. Meanwhile, the cam members 408 (FIG. 3, only one shown) enter the cam slots 404 (FIG. 4B, only one shown) of the tunnel 402 and are guided downwardly to pivot the door 206 of the substrate carrier 112 down (as shown in FIGS. 2B, 2C and 7E). At the same time, the clamping members 504 travel into the notches 536 (FIGS. 5B, 7B and 7D) of the latch members 302. The clamping members 504 enter the notches 536, thereby moving away from the substrate 202 and releasing the substrate 202 from clamping. In at least one embodiment, the notches 536 of each latch member 302 are positioned so that the clamping members 504 will be located within the notches 536 when the cam member 408 is at the bottom of the cam slot 404 and/or the door 206 is fully opened.

Since the door 206 (if present) has been unlatched and opened, and the substrate 202 has been unclamped, the substrate 202 is available for extraction from the substrate carrier 112. A substrate handling robot (not shown) of the factory interface 102 extracts the substrate 202 from the substrate carrier 112 and loads the substrate 202 into the processing tool 100. For example, a blade (not shown) of the substrate handler may extend below the substrate 202 (e.g., in region 533 of the substrate carrier 112 (FIG. 7C)) and lift the substrate 202 past the hollowed out region 520 to area 708 of the substrate carrier 112 (FIG. 7B). The substrate 202 then may be loaded into the processing tool 100. The substrate 202 is processed in the processing tool 100. After the processing of the substrate 202 is complete, the substrate handling robot returns the substrate 202 to the substrate carrier 112.

The carrier moving mechanism 114 then undocks the substrate carrier 112 from the port 104. The undocking movement of the substrate carrier 112 causes the cam followers 408 to be guided upwardly in the cam slots 404, to close the door 206. As the carrier housing 200 is moved away from the stops 412 of the carrier opening mechanism 400, the biasing force of the springs 312 urges the latch members 302 outwardly from the enclosure 210, bringing the fingers 310 into engagement with the tabs 300 on the door 206. Thus the door 206 is again latched in a closed position.

By the same movement of the latch members 302, notches 536 (FIGS. 5B, 7B) in the latch members 302 are moved away from the clamping members 504. In response thereto, the sides 512 of the latch members 302 force the clamping members 504 into contact with the substrate 202, thereby clamping the substrate 202. The latched substrate carrier 112, with the substrate 202 clamped therein, is now ready to be transported away from the substrate transfer location 108 and may be moved to another processing tool for further processing or to another location in the fabrication facility.

The present invention provides for secure latching of the door of a substrate carrier, and secure clamping of a substrate within the substrate carrier. As a result, rough handling or damage to the substrate and/or particulate contamination of the substrate, may be avoided.

The foregoing description discloses only exemplary embodiments of the invention; modifications of the above disclosed apparatus which fall within the scope of the invention will be readily apparent to those of ordinary skill in the art. For example, although the present invention is illustrated with respect to single substrate carriers, it is also contemplated to apply the present invention to substrate carriers that hold more than one substrate. "Single substrate carrier" will be understood to mean a substrate carrier shaped and sized to contain only one substrate at a time.

As illustrated herein the inventive substrate carrier includes both an inventive latching mechanism and an inventive substrate clamping mechanism. However, it is also contemplated in accordance with the invention to provide a substrate carrier that includes a latching mechanism without a substrate clamping mechanism, or to provide a substrate carrier having a substrate clamping mechanism without a latching mechanism. Alternatively or additionally, the clamping members 504 may be configured to rotate away from the substrate 202.

The present invention may be used in conjunction with any processing tool such as one which performs one or more of the following: deposition, oxidation, etching, thermal processing, photolithography, etc. Instead of employing the inventive substrate transfer location at a factory interface, the inventive substrate transfer location may be employed directly at a load lock of a processing tool or at any other suitable location.

The present invention has been illustrated in connection with interfacing a substrate carrier to a processing tool. However, the present invention is equally applicable to interfacing a substrate carrier to a metrology location, to a chemical/mechanical polishing (CMP) device, or to any other location or device to which a substrate may be transported in a substrate carrier.

Figure 8:
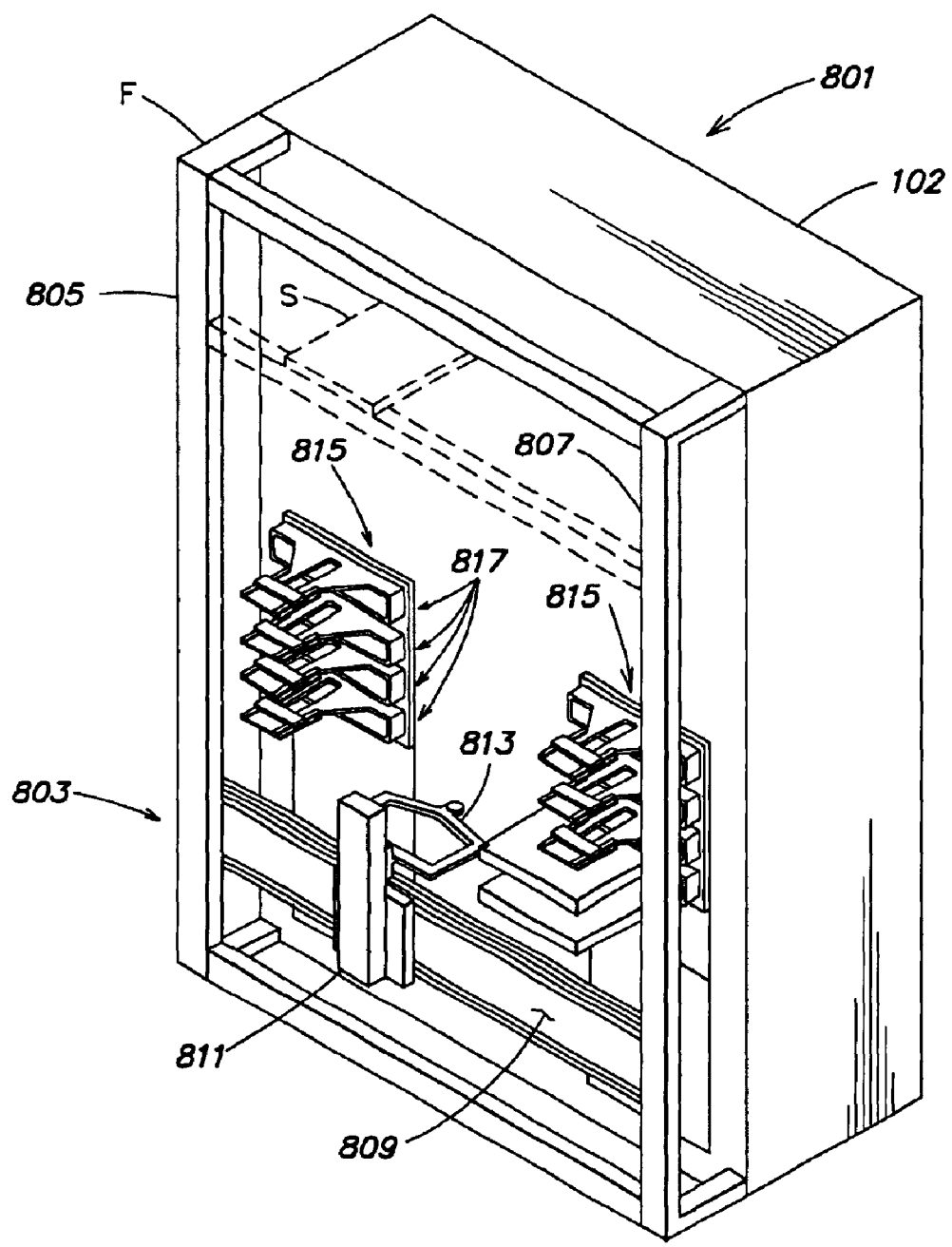
FIG. 8 is an isometric view of an alternative embodiment of a substrate loading station that includes a substrate carrier handler that may be employed with the present invention.

Instead of the support platform 110 and the carrier moving mechanism 114 illustrated herein, the substrate transfer location 108 may have a gripper (not shown) which functions as a substrate carrier support structure and is adapted to grip the substrate carrier 112 (e.g., by a top flange of the substrate carrier) and to move the substrate carrier 112 toward and away from the port 104, as disclosed in previously incorporated U.S. patent application Ser. No. 60/407,337, filed Aug. 31, 2002 titled "Wafer Loading Station with Docking Grippers at Docking Stations". For example, FIG. 8 is an isometric view of an alternative embodiment of a substrate loading station that may include a substrate carrier handler that may be employed with the present invention. In FIG. 8, reference numeral 801 indicates the alternative substrate loading station. Reference numeral 803 indicates an alternative substrate carrier handler. The substrate loading station 801 of FIG. 8 may be generally similar to an embodiment of a loading station disclosed in above-referenced co-pending U.S. patent application Ser. No. 60/407,337, filed Aug. 31, 2002 and titled "Wafer Loading Station with Docking Grippers at Docking Stations".

The substrate carrier handler 803 of FIG. 8 includes a pair of vertical guides 805, 807 and a horizontal guide 809 which is mounted for vertical movement on the vertical guides 805, 807. A support 811 is mounted on the horizontal guide 809 for horizontal movement along the horizontal guide 809. An end effector 813 is mounted on the support 811. The end effector 813 may comprise, for example, an end effector capable of changing the orientation of a substrate carrier from vertical to horizontal and vice versa as described in previously incorporated U.S. patent application Ser. No. 60/407,452, filed Aug. 31, 2002 and titled "End Effector Having Mechanism For Reorienting A Wafer Carrier Between Vertical And Horizontal Orientations" (Docket No. 7097). Any other suitable end effector also may be employed, such as an end effector which grips a substrate carrier via an overhead transfer flange of the substrate carrier.

It will be observed that the substrate loading station 801 has two columns of docking stations 815, although fewer or more columns of docking stations may be employed. Each docking station 815 includes a plurality of docking grippers 817. Each docking gripper 817 is adapted to support a substrate carrier via its overhead transfer flange, and to dock and undock a substrate carrier (as previously described). Alternatively, the docking grippers may be replaced with docking platforms that support a substrate carrier (e.g., via the substrate carrier's bottom surface) and that move toward and away from the cleanroom wall (or front wall of a chamber such as a factory interface chamber) to which the docking platform is mounted.

Preferably, the substrate loading station 801 comprises a frame F to which the vertical and horizontal guides 805, 807 and 809 are coupled. In this manner, the preferred substrate loading station 801 is modular and may be quickly installed and calibrated. In the event the substrate loading station 801 includes one or more storage shelves S (shown in phantom), the storage shelf S also may be mounted on the frame F. By mounting both the substrate carrier handler and the storage shelf or shelves to the frame, the substrate carrier handler and storage shelves have a predetermined position relative to each other. This further facilitates installation and calibration, and is another advantage of employing a modular substrate loading station. Similarly, other mechanisms such as dedicated mechanisms for loading and/or unloading substrate carriers from an overhead factory transport system may be advantageously mounted to the frame F as described, for example, in previously incorporated U.S. patent application Ser. No. 60/407,451, filed Aug. 31, 2002 and titled "System For Transporting Wafer Carriers".

In one aspect, the frame F may be mounted to predetermined mounting locations (e.g., predrilled bolt holes, etc.) on the clean room wall, or on the front wall of a chamber (e.g., a factory interface chamber). Preferably, the wall also has predetermined mounting locations to which the docking grippers or docking platforms are mounted. Additionally, the wall may have predetermined mounting locations to which a substrate carrier opening mechanism 400 may be mounted. When the frame F, the docking mechanisms, and the substrate carrier opening mechanism are each mounted to predetermined locations on the same surface, the relative positions of each are predetermined, and installation and calibration of the substrate loading station 801 is facilitated.

While the present invention has been disclosed in connection with exemplary embodiments thereof, it should be understood that other embodiments may fall within the spirit and scope of the invention, as defined by the following claims.

The invention claimed is:

1. An automatic door opener comprising:
   a platform adapted to support a substrate carrier;
   a door opening mechanism adapted to open a door of the substrate carrier while the substrate carrier is supported by the platform; and
   a tunnel adapted to:
      extend from an opening in a clean room wall toward the platform and at least partially surround the platform; and
      direct a flow of air from the clean room wall toward the platform and out of the tunnel.

2. The automatic door opener of claim 1 wherein the substrate carrier comprises a front opening substrate carrier.

3. The automatic door opener of claim 1 wherein the substrate carrier comprises a single substrate carrier.

4. The automatic door opener of claim 1 wherein the substrate carrier comprises a multi-substrate carrier.

5. The automatic door opener of claim 1 wherein the substrate carrier comprises a front opening unified pod.

6. The automatic door opener of claim 1 wherein the door opening mechanism is located within the tunnel.

7. The automatic door opener of claim 1 wherein the door opening mechanism is adapted to employ a docking movement to open the door of the substrate carrier.

8. The automatic door opener of claim 1 wherein the tunnel is adapted to direct a flow of air from the clean room wall toward the platform by allowing a flow of air from the opening of the clean room wall to the platform in response to a pressure differential maintained between the opening of the clean room wall and the platform.

9. The automatic door opener of claim 1 wherein the flow of air comprises a laminar air flow that at least partially surrounds the substrate carrier.

10. The automatic door opener of claim 1 wherein the clean room wall comprises a wall of a factory interface of a processing tool.

11. The automatic door opener of claim 1 wherein the door opening mechanism includes a port door that is adapted to unlock, receive and support the door of the substrate carrier and then lower so as to allow a substrate to be removed from the substrate carrier.

12. The automatic door opener of claim 11 wherein the port door is adapted to move away from the substrate carrier and then lower.

13. The automatic door opener of claim 11 wherein the platform is adapted to:
move the substrate carrier away from the port door so as to allow the port door to lower; and
then move the substrate carrier back toward the opening in the clean room wall.

14. A method of loading a substrate into a processing tool comprising:
loading a substrate carrier onto a platform positioned adjacent a clean room wall that separates the platform from the processing tool;
at least partially surrounding the substrate carrier with a tunnel that extends from an opening in the clean room wall toward the platform;
opening a door of the substrate carrier while the substrate carrier is supported by the platform; and
directing a flow of air from the clean room wall toward the platform and out of the tunnel.

15. The method of claim 14 wherein the substrate carrier comprises a front opening substrate carrier.

16. The method of claim 14 wherein the substrate carrier comprises a single substrate carrier.

17. The method of claim 14 wherein the substrate carrier comprises a multi-substrate carrier.

18. The method of claim 14 wherein the substrate carrier comprises a front opening unified pod.

19. The method of claim 14 wherein opening the door of the substrate carrier comprising employing a door opening mechanism located within the tunnel to open the door of the substrate carrier.

20. The method of claim 14 wherein opening the door of the substrate carrier comprising employing a door opening mechanism that is adapted to employ a docking movement to open the door of the substrate carrier.

21. The method of claim 14 wherein directing a flow of air from the clean room wall toward the platform comprises allowing a flow of air from the opening of the clean room wall to the platform in response to a pressure differential maintained between the opening of the clean room wall and the platform.

22. The method of claim 21 further comprising generating the pressure differential between the opening of the clean room wall and the platform.

23. The method of claim 22 wherein generating the pressure differential between the opening of the clean room wall and the platform comprises flowing filtered air into a factory interface associated with the processing tool.

24. The method of claim 22 wherein generating the pressure differential between the opening of the clean room wall and the platform comprises maintaining a pressure differential of between about 0.0005 to 0.2 inches of water between the opening of the clean room wall and the platform.

25. The method of claim 14 wherein the clean room wall comprises a wall of a factory interface of the processing tool.

26. The method of claim 14 wherein directing a flow of air from the clean room wall toward the platform and out of the tunnel comprises directing a laminar air flow from the clean room wall toward the platform and out of the tunnel.

* * * * *